(12) United States Patent
Britcher et al.

(10) Patent No.: US 8,127,713 B2
(45) Date of Patent: Mar. 6, 2012

(54) MULTI-CHANNEL DEVELOPER SYSTEM

(75) Inventors: Eric B. Britcher, San Jose, CA (US); Yevgeniy Rabinovich, Fremont, CA (US); Svetlana Sherman, San Jose, CA (US); Masami Ohtani, Shimogyo-ku (JP)

(73) Assignee: Sokudo Co., Ltd., Kyoto (JP)

( * ) Notice: Subject to any disclaimer, the term of this patent is extended or adjusted under 35 U.S.C. 154(b) by 260 days.

(21) Appl. No.: 12/334,156

(22) Filed: Dec. 12, 2008

(65) Prior Publication Data
US 2010/0151690 A1   Jun. 17, 2010

(51) Int. Cl.
*B05C 11/00* (2006.01)
(52) U.S. Cl. ............... 118/697; 438/7; 257/E21.525; 29/25.01
(58) Field of Classification Search ...... 438/7; 118/697; 257/E21.525; 29/25.01
See application file for complete search history.

(56) References Cited

U.S. PATENT DOCUMENTS

| | | | |
|---|---|---|---|
| 4,361,163 A | 11/1982 | Aigo | |
| 6,267,853 B1 | 7/2001 | Dordi et al. | |
| 7,282,675 B2 | 10/2007 | Quach et al. | |
| 2004/0115567 A1 | 6/2004 | Mandal et al. | |
| 2006/0245855 A1 | 11/2006 | Hamada | |
| 2007/0111519 A1 | 5/2007 | Lubomirsky et al. | |
| 2008/0102563 A1 | 5/2008 | Lange et al. | |
| 2008/0296316 A1 | 12/2008 | Ishikawa et al. | |

OTHER PUBLICATIONS

International Search Report and Written Opinion of PCT Application No. PCT/US2009/067038, mailed Feb. 4, 2010, 9 pages total.
Notification Concerning Transmittal of International Preliminary Report on Patentability; International Preliminary Report on Patentability, 8 pages.

*Primary Examiner* — Michelle Estrada
(74) *Attorney, Agent, or Firm* — Kilpatrick Townsend & Stockton LLP

(57) ABSTRACT

An apparatus for dispensing fluid during semiconductor substrate processing operations comprises an enclosure having a first side and a second side. The enclosure comprises a first processing station and a second processing station. The second processing station is positioned adjacent to the first processing station. In addition, the substrate processing apparatus includes a first dispense arm configured to deliver a fluid to the first processing station wherein the first dispense arm is positioned between the first side and the first processing station and a second dispense arm configured to deliver the fluid to the second processing station wherein the second dispense arm is positioned between the second side and the second processing station. The substrate processing apparatus also comprises a first rinse arm configured to deliver a rinsing fluid to the first processing station and a second rinse arm configured to deliver the rinsing fluid to the second processing station.

16 Claims, 8 Drawing Sheets

MULTI-CHANNEL DEVELOPER SYSTEM

BACKGROUND OF THE INVENTION

The present invention relates generally to the field of semiconductor processing equipment. More particularly, the present invention relates to a method and apparatus for dispensing fluids onto a semiconductor substrate. Merely by way of example, the method and apparatus has been applied to two processing stations in a single chamber in a coat/develop module. However, it would be recognized that the invention has a much broader range of applicability.

Portions of the process of forming electronic devices are commonly performed in a multi-chamber processing system (e.g., a cluster tool) that has the capability to sequentially process substrates, (e.g., semiconductor wafers) in a controlled processing environment. A typical cluster tool used to deposit (i.e., coat) and develop a photoresist material, commonly known as a track lithography tool, will include a mainframe that houses multiple substrate transfer robots which transport substrates between a pod/cassette mounting device and multiple processing chambers that are connected to the mainframe. Cluster tools are often used so that substrates can be processed in a repeatable way in a controlled processing environment. A controlled processing environment has many benefits, which include minimizing contamination of the substrate surfaces during transfer and during completion of the various substrate processing steps. Processing in a controlled environment thus reduces the number of generated defects and improves device yield.

Two types of processing chamber generally included in a track lithography tool are substrate coating modules and substrate developing modules, sometimes collectively referred to as a coat/develop module. Typically, in a coat module, a spin coating process is used to form a layer of photoresist or other coating on an upper surface of a substrate. One method mounts a substrate on a spin chuck, which is rotated at up to several thousand revolutions per minute (RPM). Several milliliters of a liquid (e.g., photoresist) is applied to a central region of the substrate and the spinning action of the spin chuck disperses the liquid over the surface of the substrate. The coating is processed in subsequent steps to form features on the substrate as is well known to one of skill in the art. In develop modules; a developer is applied to the surface of the substrate after exposure of the photoresist. The coat/develop modules contain a number of similarities, as well as differences, including different nozzle designs corresponding to varying viscosities of dispense fluids, among other factors.

In some previously known coat/develop modules, a single spin bowl is attached to a system for dispensing photoresist or other coating liquids. In some photoresist coating applications, it is desirable to provide a number of different coatings, including different thicknesses and materials. Particularly, the industry transition to 300 mm substrates has led to an increase in the number of different coating liquids. Accordingly, in some coat/develop modules, and particularly in photoresist coat modules, the dispense system may include a number of different dispense nozzles dispensing different photoresists. Additionally, a number of other dispense nozzles may be included that provide photoresists with varying concentrations of solutions and solvents.

In some coat/develop modules, the dispense nozzles are fabricated to precise tolerances in accordance with the tolerances associated with a particular semiconductor process. As a result of the number and quality of the dispense nozzles in some of these modules, the cost of the dispense system may be much larger than the cost of the spin bowl.

In general, coat/develop applications rotate the substrate to achieve a predetermined rotation speed, dispense the coating fluid, and then continue rotating the substrate for a predetermined period after the dispense step is completed. As described above, the rotation of the substrate is utilized to disperse the coating/developing fluid over the surface of the substrate. In these processes, the dispense system is inactive while the substrate rotation dispenses the resist. Therefore, in some dispense systems, the most expensive system components, namely those included in the dispense apparatus, are idle during a significant fraction of the processing time.

As the complexity of the devices fabricated increases, so does the need for more accurate and efficient processing equipment. Traditionally, the throughput (# of substrates processed/hour) of a developer system was limited by the number of develop chambers present in the system. The demand for lower Cost of Ownership (CoO) is increasing with each successive generation of semiconductor equipment. One of the important factors in calculation of the CoO is the throughput of the system. The throughput of a system is inversely proportional to its CoO. To satisfy the requirements for lower CoO, a higher throughput for the system is desirable. Thus, there is a need in the industry to deploy substrate-processing systems that can process more wafers per hour but do so with an existing or lower footprint. This will ensure that advantages gained by the increase in throughput are not offset by a larger footprint of the system and consequently lead to a lower footprint productivity.

Therefore, a need exists in the art for improved coat/develop modules and improved methods of operating the same.

SUMMARY OF THE INVENTION

According to the present invention, techniques related to the field of semiconductor processing equipment are provided. More particularly, the present invention includes a method and apparatus for dispensing fluids onto a semiconductor substrate. Merely by way of example, the method and apparatus has been applied to a developer module having two develop stations with independent dispense arms. However, it would be recognized that the invention has a much broader range of applicability.

In a specific embodiment of the present invention, an apparatus for dispensing fluid during semiconductor substrate processing operations is provided. The apparatus includes an enclosure having a first side and a second side. The enclosure includes a first processing station adjacent the first side and configured to hold a substrate and a second processing station adjacent the second side and configured to hold the substrate. The second processing station is positioned adjacent to the first processing station. In addition, the substrate processing apparatus includes a first dispense arm configured to deliver a fluid to the first processing station wherein the first dispense arm is positioned between the first side and the first processing station and a second dispense arm configured to deliver the fluid to the second processing station wherein the second dispense arm is positioned between the second side and the second processing station. The substrate processing apparatus also includes a first rinse arm configured to deliver a rinsing fluid to the first processing station and a second rinse arm configured to deliver the rinsing fluid to the second processing station.

In another embodiment of the present invention, a method of dispensing fluid onto a semiconductor substrate using the substrate processing apparatus is provided. The method includes positioning the substrate onto a substrate support, positioning a dispense arm above the substrate, and dispensing a fluid onto a surface of the substrate using the dispense arm. The dispensing of the fluid is performed for a predetermined time. The method also includes positioning a rinse arm in a first position prior to the expiration of the predetermined time. The first position is different than a home position of the rinse arm. The method further includes retracting the dispense arm while concurrently moving the rinse arm to a second position above the substrate and dispensing a rinsing fluid onto the substrate.

In yet another embodiment of the present invention, a dispense arm for dispensing a fluid is provided. The dispense arm includes a nozzle head assembly configured to hold one or more nozzles, an arm assembly coupled to the nozzle head assembly and having an internal channel, and a length of flexible tubing disposed in the internal channel and configured to deliver the developer fluid to the nozzle head assembly.

In yet another embodiment of the present invention, a track lithography tool is provided. The track lithography tool includes a front end module adapted to receive FOUPs containing a plurality of substrates, a central module comprising a plurality of processing tools, and a rear module coupled to a scanner. The track lithography tool also includes at least one robot adapted to receive a substrate from the front end module and deliver the substrate to either a processing tool and/or the rear module. One of the plurality of processing tools is a substrate processing apparatus for dispensing fluid during semiconductor substrate processing operations.

The substrate processing apparatus includes an enclosure having a first side and a second side. The enclosure includes a first processing station adjacent the first side and configured to hold a substrate and a second processing station adjacent the second side and configured to hold the substrate. The second processing station is positioned adjacent to the first processing station. In addition, the substrate processing apparatus includes a first dispense arm configured to deliver a fluid to the first processing station. The first dispense arm is positioned between the first side and the first processing station. The substrate processing apparatus also includes a second dispense arm configured to deliver the fluid to the second processing station. The second dispense arm is positioned between the second side and the second processing station. The substrate processing apparatus also includes a first rinse arm configured to deliver a rinsing fluid to the first processing station and a second rinse arm configured to deliver the rinsing fluid to the second processing station.

Many benefits are achieved by way of the present invention over conventional techniques. For example, the present technique allows for processing more wafers per hour within the same footprint thus increasing the footprint productivity of the system. Moreover, embodiments of the present invention provide for increased system reliability and throughput. These and other embodiments of the invention along with many of its advantages and features are described in more detail in conjunction with the text below and attached figures.

DETAILED DESCRIPTION OF SPECIFIC EMBODIMENTS

Figure 1:
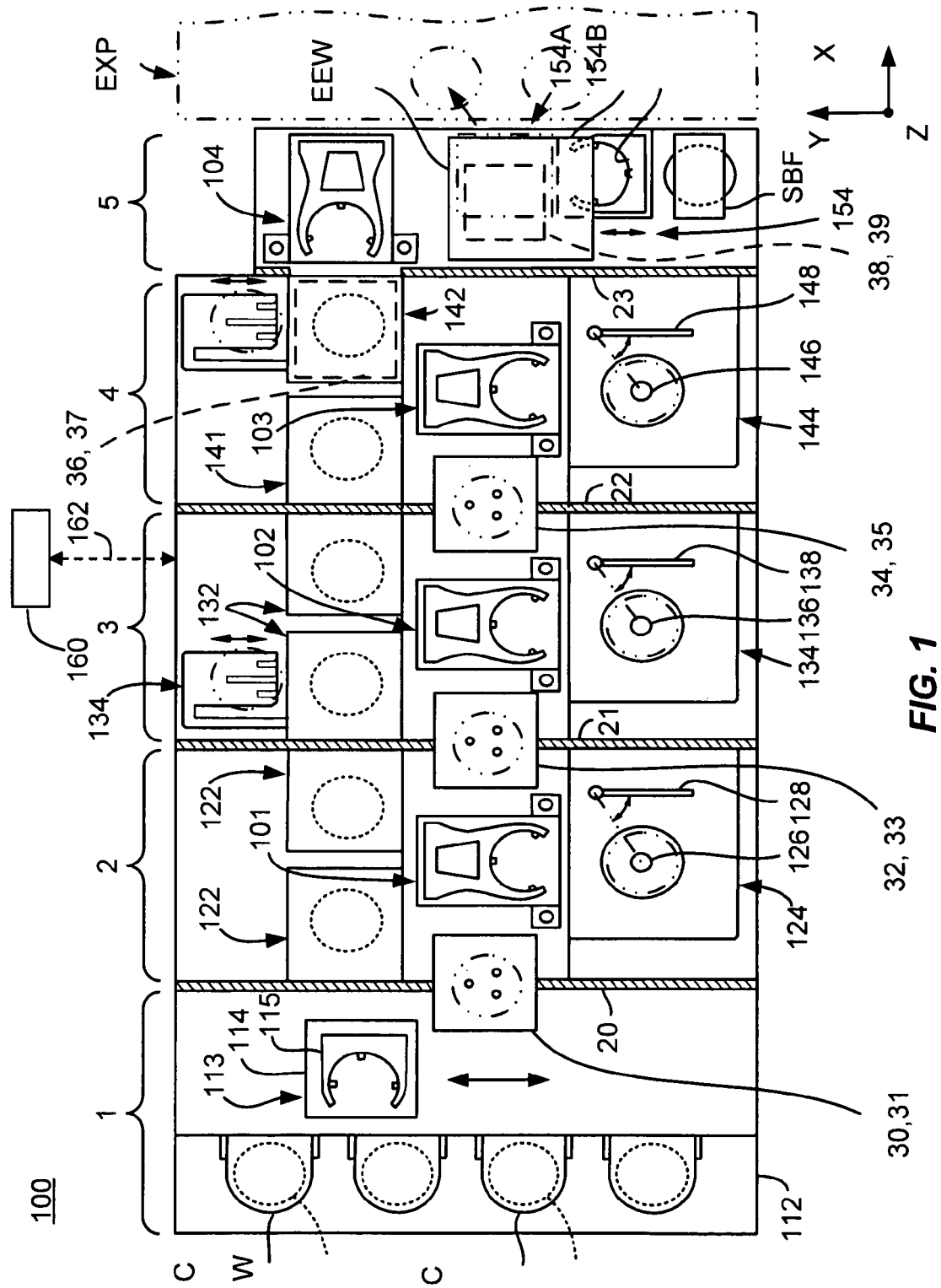
FIG. 1 is a simplified schematic diagram of a track lithography tool in which embodiments of the present invention may be implemented.

FIG. 1 is a plan view of a track lithography tool according to an embodiment of the present invention. In the embodiment illustrated in FIG. 1, the track lithography tool is coupled to an immersion scanner. An XYZ rectangular coordinate system in which an XY plane is defined as the horizontal plane and a Z-axis is defined to extend in the vertical direction is additionally shown in FIG. 1 for purposes of clarifying the directional relationship therebetween.

In a particular embodiment, the track lithography tool is used to form, through use of a coating process, an anti-reflection (AR) and a photoresist film on substrates, for example, semiconductor substrates. The track lithography tool is also used to perform a development process on the substrates after they have been subjected to a pattern exposure process. The substrates processed by the track lithography tool are not limited to semiconductor substrates, but may include glass substrates for a liquid crystal display device, and the like.

The track lithography tool 100 illustrated in FIG. 1 includes an factory interface block 1, a BARC (Bottom Anti-Reflection Coating) block 2, a resist coating block 3, a development processing block 4, and a scanner interface block 5. In the track lithography tool, the five processing blocks 1 to 5 are arranged in a side-by-side relation. An exposure unit (or stepper) EXP, which is an external apparatus separate from the track lithography tool is provided and coupled to the scanner interface block 5. Additionally, the track lithography tool and the exposure unit EXP are connected via LAN lines 162 to a host computer 160.

The factory interface block 1 is a processing block for transferring unprocessed substrates received from outside of the track lithography tool to the BARC block 2 and the resist coating block 3. The factory interface block 1 is also useful for transporting processed substrates received from the development processing block 4 to the outside of the track lithography tool. The factory interface block 1 includes a table 112 configured to receive a number of (in the illustrated embodiment, four) cassettes (or carriers) C, and a substrate transfer mechanism 113 for retrieving an unprocessed substrate W from each of the cassettes C and for storing a processed substrate W in each of the cassettes C. The substrate transfer mechanism 113 includes a movable base 114, which is movable in the Y direction (horizontally) along the table 112, and a robot arm 115 mounted on the movable base 114.

The robot arm 115 is configured to support a substrate W in a horizontal position during substrate transfer operations. Additionally, the robot arm 115 is capable of moving in the Z direction (vertically) in relation to the movable base 114, pivoting within a horizontal plane, and translating back and forth in the direction of the pivot radius. Thus, using the substrate transfer mechanism 113, the holding arm 115 is able to gain access to each of the cassettes C, retrieve an unprocessed substrate W out of each cassette C, and store a processed substrate W in each cassette C. The cassettes C may be one or several types including: an SMIF (standard mechanical interface) pod; an OC (open cassette), which exposes stored substrates W to the atmosphere; or a FOUP (front opening unified pod), which stores substrates W in an enclosed or sealed space.

The BARC block 2 is positioned adjacent to the factory interface block 1. Partition 20 may be used to provide an atmospheric seal between the factory interface block 1 and the BARC block 2. The partition 20 is provided with a pair of vertically arranged substrate rest parts 30 and 31 each used as a transfer position when transferring a substrate W between the factory interface block 1 and the BARC block 2.

The upper substrate rest part 30 is used for the transport of a substrate W from the factory interface block 1 to the BARC block 2. The substrate rest part 30 includes three support pins. The substrate transfer mechanism 113 of the factory interface block 1 places an unprocessed substrate W, which was taken out of one of the cassettes C, onto the three support pins of the substrate rest part 30. A transport robot 101 in the BARC block 2 (described more fully below) is configured to receive the substrate W placed on the substrate rest part 30. The lower substrate rest part 31, on the other hand, is used for the transport of a substrate W from the BARC block 2 to the factory interface block 1. The substrate rest part 31 also includes three support pins. The transport robot 101 in the BARC block 2 places a processed substrate W onto the three support pins of the substrate rest part 31. The substrate transfer mechanism 113 is configured to receive the substrate W placed on the substrate rest part 31 and then store the substrate W in one of the cassettes C. Pairs of substrate rest parts 32-39 (which are described more fully below) are similar in construction and operate in an analogous manner to the pair of substrate rest parts 30 and 31.

The substrate rest parts 30 and 31 extend through the partition 20. Each of the substrate rest parts 30 and 31 include an optical sensor (not shown) for detecting the presence or absence of a substrate W thereon. Based on a detection signal from each of the sensors, control of the substrate transfer mechanism 113 and the transport robot 101 of the BARC block 2 is exercised to transfer and receive a substrate W to and from the substrate rest parts 30 and 31.

Referring to FIG. 1 again, BARC block 2 is also included in the track lithography tool 100. The BARC block 2 is a processing block for forming an AR film (also referred to as a BARC) on a substrate using a coating process. The BARC is positioned in the film stack under the photoresist film, which is subsequently deposited. The BARC reduces standing waves or halation occurring during exposure. The BARC block 2 includes a bottom coating processor 124 configured to coat the surface of a substrate W with the AR film, a pair of thermal processing towers 122 for performing one or more thermal processes that accompany the formation of the AR film, and the transport robot 101, which is used in transferring and receiving a substrate W to and from the bottom coating processor 124 and the pair of thermal processing towers 122.

In the BARC block 2, the bottom coating processor 124 and the pair of thermal processing towers 122 are arranged on opposite sides of the transport robot 101. Specifically, the bottom coating processor 124 is on the front side of the track lithography tool and the pair of thermal processing towers 122 are on the rear side thereof. Additionally, a thermal barrier (not shown) is provided on the front side of the pair of thermal processing towers 122. Thus, the thermal crosstalk from the pair of thermal processing towers 122 to the bottom coating processor 124 is reduced by the spacing between the bottom coating processor 124 and the pair of thermal processing towers 122 and through the use of the thermal barrier.

Generally, the bottom coating processor 124 includes three vertically stacked coating processing units that are similar in construction. The three coating processing units are collectively referred to as the bottom coating processor 124, unless otherwise identified. Each of the coating processing units includes a spin chuck 126 on which the substrate W is rotated in a substantially horizontal plane while the substrate W is held in a substantially horizontal position through suction. Each coating processing unit also includes a coating nozzle 128 used to apply a coating solution for the AR film onto the substrate W held on the spin chuck 126, a spin motor (not shown) configured to rotatably drive the spin chuck 126, a cup (not shown) surrounding the substrate W held on the spin chuck 22, and the like.

The thermal processing towers 122 include a number of bake plates used to heat a substrate W to a predetermined temperature and a number of cool plates used to cool a heated substrate down to a predetermined temperature and thereafter maintain the substrate at the predetermined temperature. The bake plates and cool plates are vertically stacked, with the cool plates generally mounted underneath the bake plates. The thermal processing towers may also include a number of vertically stacked adhesion promotion units (e.g., HMDS treatment units). Vertical stacking of processing units reduces the tool footprint and reduces the amount of ancillary equipment (e.g., temperature and humidity control apparatus, electrical service, and the like).

Referring once again to FIG. 1, the resist coating block 3 is a processing block for forming a resist film on the substrate W after formation of the AR film in the BARC block 2. In a particular embodiment, a chemically amplified resist is used as the photoresist. The resist coating block 3 includes a resist coating processor 134 used to form the resist film on top of the AR film, a pair of thermal processing towers 132 for performing one or more thermal processes accompanying the resist coating process, and the transport robot 102, which is used to transfer and receive a substrate W to and from the resist coating processor 134 and the pair of thermal processing towers 132.

Similar to the configuration of the processors in BARC block 2, the resist coating processor 134 and the pair of thermal processing towers 132 are arranged on opposite sides of the transport robot 102. A thermal barrier (not shown) is provided to reduce thermal crosstalk between processors. Generally, the resist coating processor 134 includes three vertically stacked coating processing units that are similar in construction. Each of the coating processing units includes a spin chuck 136, a coating nozzle 138 for applying a resist coating to the substrate W, a spin motor (not shown), a cup (not shown), and the like.

The thermal processing towers 132 include a number of vertically stacked bake chambers and cool plates. In a particular embodiment, the thermal processing tower closest to the factory interface block 1 includes bake chambers and the thermal processing tower farthest from the factory interface block 1 includes cool plates. In the embodiment illustrated in FIG. 1, the bake chambers include a vertically stacked bake plate and temporary substrate holder as well as a local transport mechanism 134 configured to move vertically and horizontally to transport a substrate W between the bake plate and the temporary substrate holder and may include an actively chilled transport arm. The transport robot 102 is identical in construction to the transport robot 101 in some embodiments. The transport robot 102 is able to independently access substrate rest parts 32 and 33, the thermal processing towers 132, the coating processing units provided in the resist coating processor 134, and the substrate rest parts 34 and 35.

The development processing block 4 is positioned between the resist coating block 3 and the scanner interface block 5. A partition 22 for sealing the development processing block from the atmosphere of the resist coating block 3 is provided. The upper substrate rest part 34 is used to transport a substrate W from the resist coating block 3 to the development processing block 4. The lower substrate rest part 35, on the other hand, is used to transport a substrate W from the development processing block 4 to the resist coating block 3. As described above, substrate rest parts 32-39 may include an optical sensor for detecting the presence or absence of a substrate W thereon. Based on a detection signal from each of the sensors, control of the various substrate transfer mechanisms and transport robots of the various processing blocks is exercised during substrate transfer processes.

The development processing block 4 includes a development processor 144 for applying a developing solution to a substrate W after exposure in the scanner EXP, a pair of thermal processing towers 141 and 142, and transport robot 103. The development processor 144 includes five vertically stacked development processing units that are similar in construction to each other. Each of the development processing units includes a spin chuck 146, a nozzle 148 for applying developer to a substrate W, a spin motor (not shown), a cup (not shown), and the like.

Thermal processing tower 142 includes bake chambers and cool plates as described above. Additionally, thermal processing tower 142 is accessible to both transport robot 103 as well as transport robot 104. Thermal processing unit 141 is accessible to transport robot 103. Additionally, thermal processing tower 142 includes substrate rest parts 36 and 37, which are used when transferring substrates to and from the development processing block 4 and the scanner interface block 5.

The interface block 5 is used to transfer a coated substrate W to the scanner EXP and to transfer an exposed substrate to the development processing block 5. The interface block 5 in this illustrated embodiment includes a transport mechanism 154 for transferring and receiving a substrate W to and from the exposure unit EXP, a pair of edge exposure units EEW for exposing the periphery of a coated substrate, and transport robot 104. Substrate rest parts 38 and 39 are provided along with the pair of edge exposure units EEW for transferring substrates to and from the scanner and the development processing unit 4.

The transport mechanism 154 includes a movable base 154A and a holding arm 154B mounted on the movable base 154A. The holding arm 154B is capable of moving vertically, pivoting, and moving back and forth in the direction of the pivot radius relative to the movable base 154A. The send buffer SBF is provided to temporarily store a substrate W prior to the exposure process if the exposure unit EXP is unable to accept the substrate W, and includes a cabinet capable of storing a plurality of substrates W in tiers.

Controller 160 is used to control all of the components and processes performed in the cluster tool. The controller 160 is generally adapted to communicate with the scanner 5, monitor and control aspects of the processes performed in the cluster tool, and is adapted to control all aspects of the complete substrate processing sequence. The controller 160, which is typically a microprocessor-based controller, is configured to receive inputs from a user and/or various sensors in one of the processing chambers and appropriately control the processing chamber components in accordance with the various inputs and software instructions retained in the controller's memory. The controller 160 generally contains memory and a CPU (not shown) which are utilized by the controller to retain various programs, process the programs, and execute the programs when necessary. The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include cache, power supplies, clock circuits, input/output circuitry, subsystems, and the like all well known in the art. A program (or computer instructions) readable by the controller 160 determines which tasks are performable in the processing chambers. Preferably, the program is software readable by the controller 160 and includes instructions to monitor and control the process based on defined rules and input data.

Additional description of a substrate processing apparatus in accordance with embodiments of the present invention is provided in U.S. Patent Application Publication No. 2006/0245855, entitled "Substrate Processing Apparatus," and U.S. Pat. No. 7,282,675 B2, entitled "Integrated Thermal Unit Having A Shuttle With A Temperature Controlled Surface," the disclosures of which are hereby incorporated by reference in their entirety. Although embodiments of the present invention are described herein in the context of the track lithography tool illustrated in FIG. 1, other architectures for track lithography tools are included within the scope of embodiments of the present invention. For example, track lithography tools utilizing Cartesian architectures are suitable for use with embodiments as described throughout the present specification. In a particular embodiment, implementation is performed for an $RF^3i$, available from Sokudo Co., Ltd. of Kyoto, Japan.

Figure 2A:
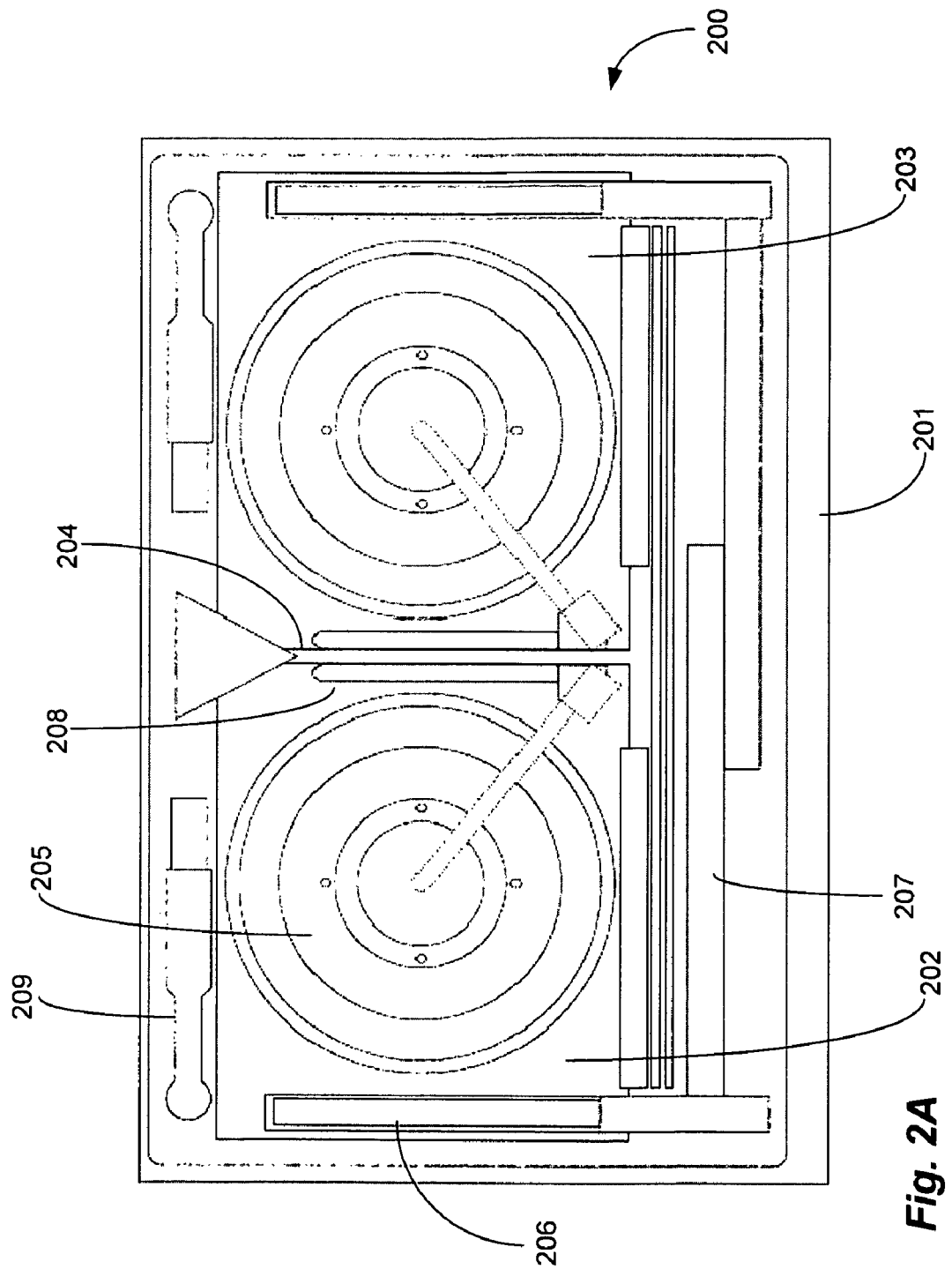
FIG. 2A illustrates a schematic view of a substrate processing apparatus according to one embodiment of this invention.

FIG. 2A is a schematic view of the substrate processing apparatus according to an embodiment of the present invention. The substrate processing apparatus 200 includes an enclosure 201. The enclosure 201 can be constructed of any suitable material, like aluminum, using conventional manufacturing techniques. Within the enclosure 201, two processing stations 202 and 203 are situated adjacent to each other. Each processing station is configured to hold a substrate. In one embodiment, the substrate processing stations are configured for circular substrates but one skilled in the art will realize that the substrate stations can be modified to hold other shapes of substrates, for example, square or rectangular substrates.

A panel 204 is centrally located and separates the two processing stations 202 and 203. However, in the embodiment illustrated in FIG. 2A, the panel 204 does not completely separate the two processing stations. Each processing station is a mirror image of the other. Both the processing stations have an identical structure in a particular embodiment. The structure of each processing station will now be described with reference to processing station 202. It should be understood that the same description is applicable to processing station 203.

Processing station 202 has a substrate holder 205 configured to hold the substrate. In one embodiment, in addition to supporting or holding the substrate, the substrate holder is configured to rotate the substrate at a predetermined speed. In one embodiment, the substrate holder of station 202 may rotate in a clockwise direction and the substrate holder of station 203 may rotate in a counter clockwise direction. In an alternative embodiment, the substrate holder may be stationery. The processing station 202 further comprises a dispense arm 206 configured to dispense fluid onto a substrate placed on the substrate holder. The dispense arm is configured to travel in a horizontal direction across the substrate between the center panel 204 and the outer wall of the enclosure 201. In one embodiment, the dispense arm 206 dispenses a developer fluid. However, the dispense arm is not limited to dispensing developer fluid and one skilled in the art will recognize that other types of fluids like photoresist and the like can also be dispensed. Each dispense arm is coupled to a mechanical assembly 207 that enables the movement of he arm. The mechanical assembly is also configured to move the dispense arm in a vertical (z-direction) direction.

The processing station 202 also includes a rinse arm 208. The rinse arm 208 is configured to dispense a rinsing fluid, for example, de-ionized water, onto the substrate. The rinse arm is coupled to the center panel 204 and is movable in a radial dimension away from the center panel 204. In one embodiment, the maximum radial distance that the rinse arm can travel is about 10 mm further than the center of the substrate. In addition, the processing station 202 may have a second dispense arm 209 depending on the application. The second dispense arm 209 is located in a perpendicular orientation from the first dispense arm and is closer to the shutter 210 described below. The second dispense arm is configured to move radially towards the center of the substrate in order to dispense fluid onto the substrate. In one embodiment, the second dispense arm is positioned closer to the substrate transport area 250, described in reference to FIG. 2A, of the track lithography tool. The second dispense arm can be configured to dispense a developer fluid in one embodiment. However one skilled in the art will recognize that other types of fluids like photoresist and the like can also be dispensed by the second dispense arm 209.

Second dispense arm 209 is coupled to a nozzle head assembly that includes multiple independent nozzles (not shown) that deliver the fluid to the surface of the substrate. The number of nozzles on the second dispense arms can range between 2 and 10. Depending on the application, the substrate processing station can either include the first dispense arm or the second dispense arm or both.

Figure 2B:
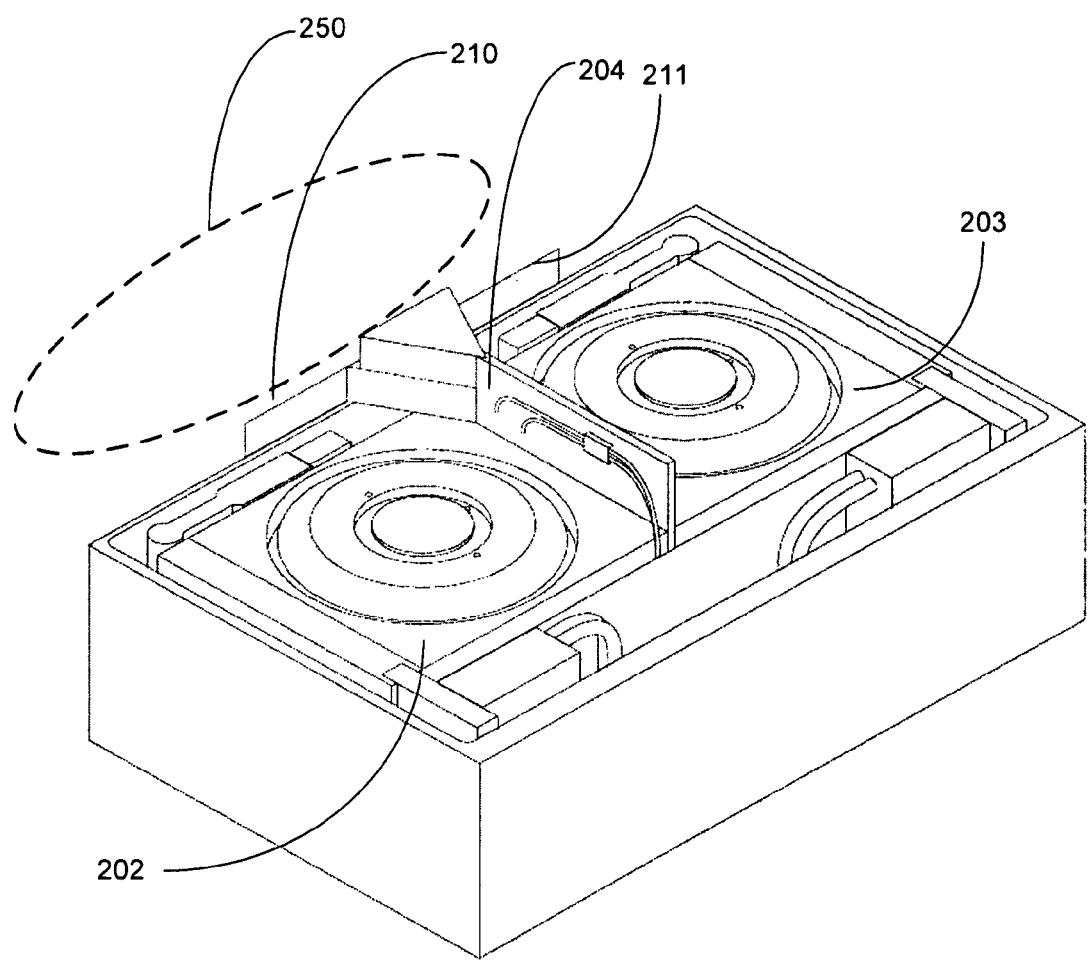
FIG. 2B illustrates a perspective view of the substrate processing apparatus according to one embodiment of this invention.

A shutter 210 is positioned to isolate the processing station 202 from the wafer transport area 250 as illustrated in FIG. 2B. In one embodiment, the shutter is 'L' shaped and configured to allow access to a substrate transport robot to deliver substrates to the substrate processing station 202. The shutter 210 in combination with the center panel 204 serves to substantially isolate the processing station 202 from the wafer transport area 250 and the other processing station 203. The shutter is typically made of a suitable material that can withstand the process chemistry used in the processing station. In one embodiment, the shutters are made of aluminum using conventional processes.

As described earlier, processing station 203 has a similar structure to that of station 202. A shutter 211 similarly operates to isolate processing station 203 from the wafer transport area 250 and the processing station 202. This provides the ability to operate the two processing stations independent of each other. Thus, if processing station 202 is disabled, the other processing station 203 can still process substrates thereby keeping the substrate processing apparatus operational. A typical photolithography tool may include multiple of these substrate processing apparatus' with each substrate processing apparatus comprising two substrate processing stations. In one embodiment, the substrate processing apparatus' are vertically stacked on top of each other. This stack can include about four substrate processing apparatus' in one embodiment. The associated software to operate the tool provides the ability to selectively disable any processing station within the stack.

Figure 2C:
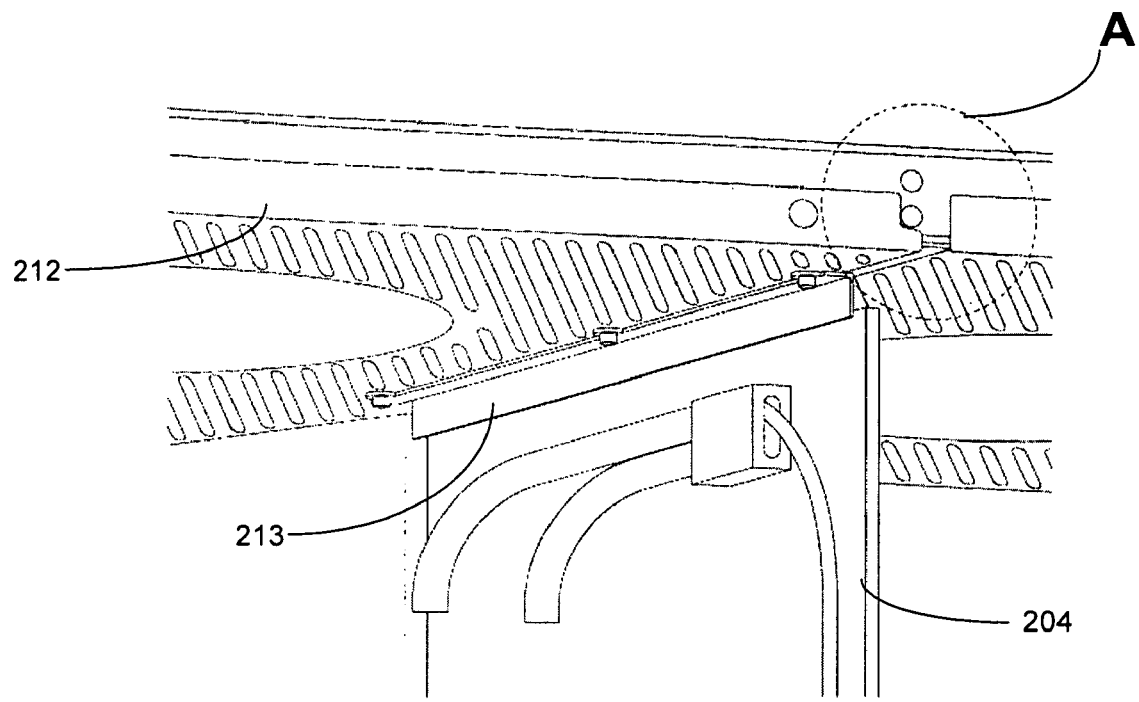
FIG. 2C is a perspective view of a portion of the substrate processing apparatus illustrating the filter assembly and the panel according to an embodiment of the present invention.
Figure 2D:
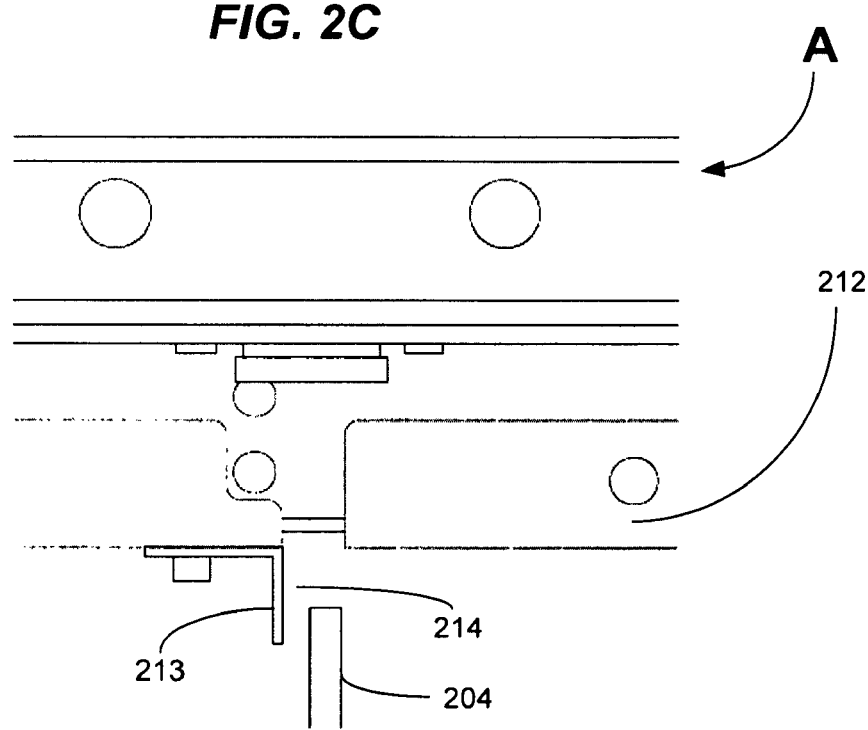
FIG. 2D is a cross sectional view of the portion of the substrate processing apparatus illustrated in FIG. 2C.

As illustrated in FIGS. 2C and 2D, the center panel 204 does not completely isolate the two processing stations. A filter assembly 212 is disposed over and laterally extends to cover at least a portion of each of the two processing stations. A small gap exists between the filter assembly 212 and the center panel 204 in the vertical direction. In some instances, mist created by the fluid being used in the substrate processing operation in one substrate processing station can travel to the other substrate processing station creating particles and causing process defects on the substrate in the adjoining process station. In order to minimize or eliminate this issue, a splashguard panel 213 is used to prevent the flow of air and particles from one processing station to another. The splashguard panel 213 is coupled to the filter assembly 212. The filter assembly 212 helps to maintain a constant the flow of air within the substrate processing apparatus. The splashguard panel 213 spans most of the depth of the enclosure 201 and overlaps the center panel 204 in a vertical dimension. This creates a labyrinth 214 for the air to flow from one processing station to the other. This labyrinth 214 impedes the free flow of air thereby reducing or in some instances eliminating the particle transfer between the two processing stations. In one embodiment, the splashguard panel 213 overlaps the center panel 204 by about 5 to 6 mm and is separated laterally from the center panel 204 by a distance of between 4 to 5 mm. Since the splashguard panel 213 is coupled to the filter assembly and not the center panel 204, it does not interfere with the accessibility to the two substrate processing stations and improves serviceability of the equipment incorporating the substrate processing stations. Although each substrate processing station above has been described as having an independent dispense arm, in an alternate embodiment a single dispense arm is used to dispense fluid to all the processing stations. In addition, another embodiment of the substrate processing apparatus has more than two processing stations. Each of these processing stations either has an independent dispense arm or incorporates a single dispense arm that serves all the processing stations.

Many benefits are realized by use of the substrate processing apparatus described above. The ability to operate the two processing stations independent of each other helps to maintain overall uptime of the processing equipment. Further, it increases the Mean Time between Failure (MTBF) of the processing apparatus thereby increasing the productivity of the equipment incorporating the substrate processing apparatus. In addition, providing multiple substrate processing apparatus' helps to improve the throughput (# of substrates processed per hour) of the equipment incorporating the substrate processing apparatus thereby providing a significant advantage in productivity.

Figure 3:
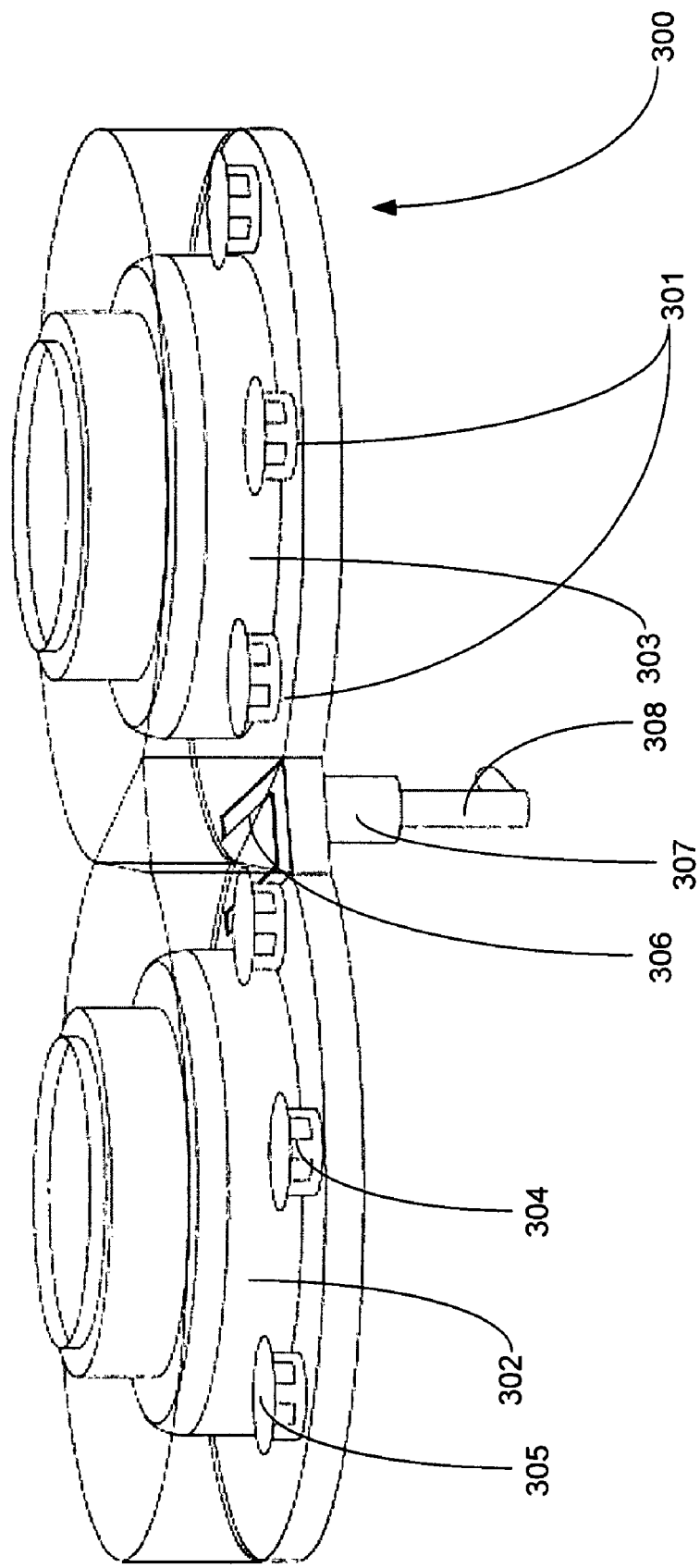
FIG. 3 illustrates a perspective view of a substrate processing apparatus according to an embodiment of this invention.

FIG. 3 shows a perspective view of the substrate processing apparatus 300 according to an embodiment of the present invention. More specifically, FIG. 3 shows the bottom section of the substrate processing apparatus. A plurality of exhaust ports 301 are coupled to the floor of the substrate processing apparatus and are arranged along the periphery of each processing station 302 and 303. The exhaust ports 301 provide openings for the air to be exhausted out of the substrate processing apparatus. Although the exhaust ports are shown arranged in a circular pattern along the periphery, one skilled in the art would recognize that the ports 301 can be arranged in any pattern and at any predetermined locations within the substrate processing apparatus. Each exhaust port 301 is raised from the floor of the substrate processing apparatus by a standoff 304. In one embodiment, the standoff is about 19 mm in height. In alternate embodiments, the standoff could have a height in the range of 5 mm to 25 mm. For example, the height of the standoff could be 25 mm, 20 mm, 15 mm, 10 mm, 5 mm etc. Raising the opening of the exhaust port above the floor of the substrate processing apparatus helps in preventing the fluid inside the substrate processing apparatus from entering the exhaust ports. In addition, the opening of the exhaust port is designed such that it reduces the exhaust velocity at the opening. This reduces the amount of fluid droplets that can be pulled into the exhaust system. In addition, each exhaust port 301 is covered by a cap 305. In one embodiment, the cap is mushroom shaped, but one skilled in the art will recognize that any other suitable shape for the cap is also possible. The cap 305 further prevents fluid and/or mist dispersed during the processing of a substrate, from entering the exhaust ports. Each of the exhaust ports 301 is connected to an exhaust manifold (not shown) that terminates in an exhaust opening. Each processing station at least has one such exhaust opening. The exhaust ducts 401 and 402, discussed below, are coupled to the exhaust openings of the processing stations 302 and 303, respectively, to provide exhaust capability.

A channel 306 on the floor of the substrate processing apparatus serves to collect all the fluid dispersed during the processing of the substrate from both the processing stations 302 and 303. The channel 306 is coupled with a drain port 307. The drain port 307 is shared by the two processing stations 302 and 303. The drain port is coupled to a drain pipe 308. In one embodiment, the drain pipe 308 is 110 mm long and extends vertically downwards from the bottom of the substrate processing apparatus 300. The drain pipe 308 is coupled to the drain assembly (not shown) to carry the dispersed fluid from within the substrate processing apparatus to an external drain outlet (not shown). The external drain outlet is coupled to the main exhaust/drain assembly. The drain pipe 308 can be fabricated from any suitable material including metal, PVC, or the like. One of advantages of the common drain port is to simplify the design of the substrate processing apparatus and that in turn lowers the cost of manufacturing. Additionally, providing the drain pipe 308 with a vertical drop creates a siphon effect in and around the drain port 307. This helps to effectively drain most of the fluid from the substrate processing apparatus. By effectively removing most of the fluid dispersed during the substrate processing operations, the substrate processing stations are maintained substantially free of any fluid, which enables the system to operate for longer periods of time before the substrate processing stations have to be physically cleaned. A common parameter to gauge the efficiency of the system in this regard is called Mean Time Between Clean (MTBC). The use of the drain port 307 in conjunction with the drain pipe 308 helps to increase the MTBC thereby increasing the efficiency and productivity of the system and reducing the overall CoO. In addition, it also helps to improve the overall reliability of the system. Furthermore, separating the drain and the exhaust assembly prevents the entry of the fluid into the exhaust system, which is a major issue in conventional designs.

Figure 4:
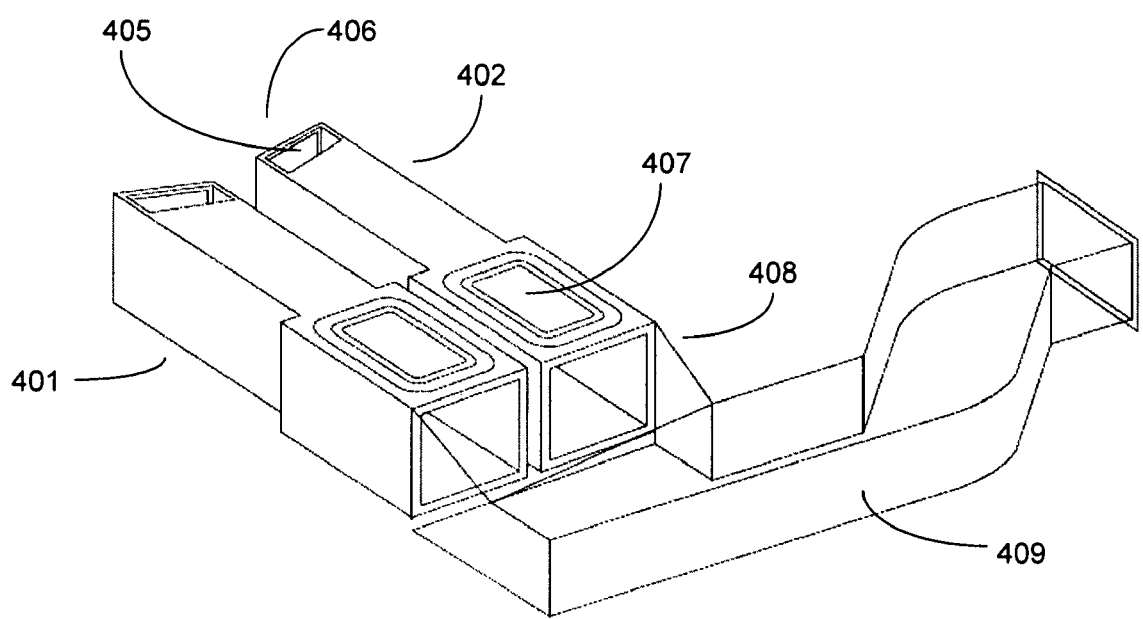
FIG. 4 illustrates a schematic view of the exhaust mechanism coupled to the substrate processing stations of the substrate processing apparatus according to one embodiment of this invention.

Each substrate processing station is coupled to an exhaust duct as depicted in FIG. 4. In one embodiment, processing station 202 is coupled to an exhaust duct 401 and processing station 203 is coupled to an exhaust duct 402. Thus, each exhaust duct provides independent exhaust capability to the two processing stations. In conventional designs using a common exhaust port for all the processing stations, the processing stations experienced unbalanced exhaust flow due to the presence of a common exhaust port. Providing independent exhaust capability to each processing station reduces the amount of cross talk experienced by the processing stations. In addition, the independent exhaust ducts provide a balanced exhaust draw for each processing station. Each exhaust duct 401 and 402 is coupled to an exhaust assembly (not shown). In one embodiment, where multiple substrate processing apparatus are vertically stacked on each other, each substrate processing apparatus may have two exhaust ducts connected with it and each pair of such exhaust ducts are coupled to the exhaust assembly at different vertical distances.

The exhaust ducts 401 and 402 are similar in structure and reference will be made to exhaust duct 401 henceforth to provide structural details of the same. Exhaust duct 401 has an area exhaust opening 405 at a first end 406. In addition to the area exhaust 405, the exhaust duct also has a bowl exhaust opening 407 towards a second end 408. The area exhaust opening 405 provides exhaust capabilities for the substrate processing stations when the bowl exhaust 407 is turned off, for example, during a developing process. In an alternative embodiment, the area exhaust may also be adapted to capture particles generated during the nozzle motion. The bowl exhaust 407 is adapted to exhaust air from each processing station. The bowl exhaust opening 407 is coupled to a bowl exhaust manifold (not shown). The bowl exhaust manifold provides a uniform distribution of exhaust capability around the interior of the substrate holder in each processing station. The bowl exhaust is used to capture, for example, mist created during a rinse cycle. In another embodiment, the bowl exhaust may be used to capture some of the fumes generated by the developer fluid during a developing process. The opening 407 is controlled by a door and damper mechanism (not shown) to control the flow rate of the air being exhausted. The amount of exhaust draw-off can be controlled using the door and damper mechanism depending on the requirements of the process being run in the processing station. For example, the bowl exhaust opening 407 is closed during a develop cycle to prevent uniformity problems that might occur due to the airflow over the substrate edge. In such a situation, the area exhaust may be used to evacuate the air from the substrate processing station.

In addition, dampers (not shown) are provided for the area exhaust 405. The dampers help regulate the exhaust flow by facilitating equal exhaust flows from the area exhaust 405 and the bowl exhaust 407. This helps to reduce or eliminate exhaust fluctuations in one processing station when the other processing station shifts between area exhaust and bowl exhaust. The second end 408 of the exhaust duct is coupled to a common exhaust duct 409. The exhaust duct 401 from the second processing station is also coupled to this common exhaust duct 409. The common exhaust duct 409 in turn is connected to a larger exhaust duct (not shown) that connects all the exhaust ducts of the vertically stacked substrate processing apparatus. The exhaust duct is designed to ensure stable and repeatable exhaust characteristics across all the substrate processing stations.

Figure 5:
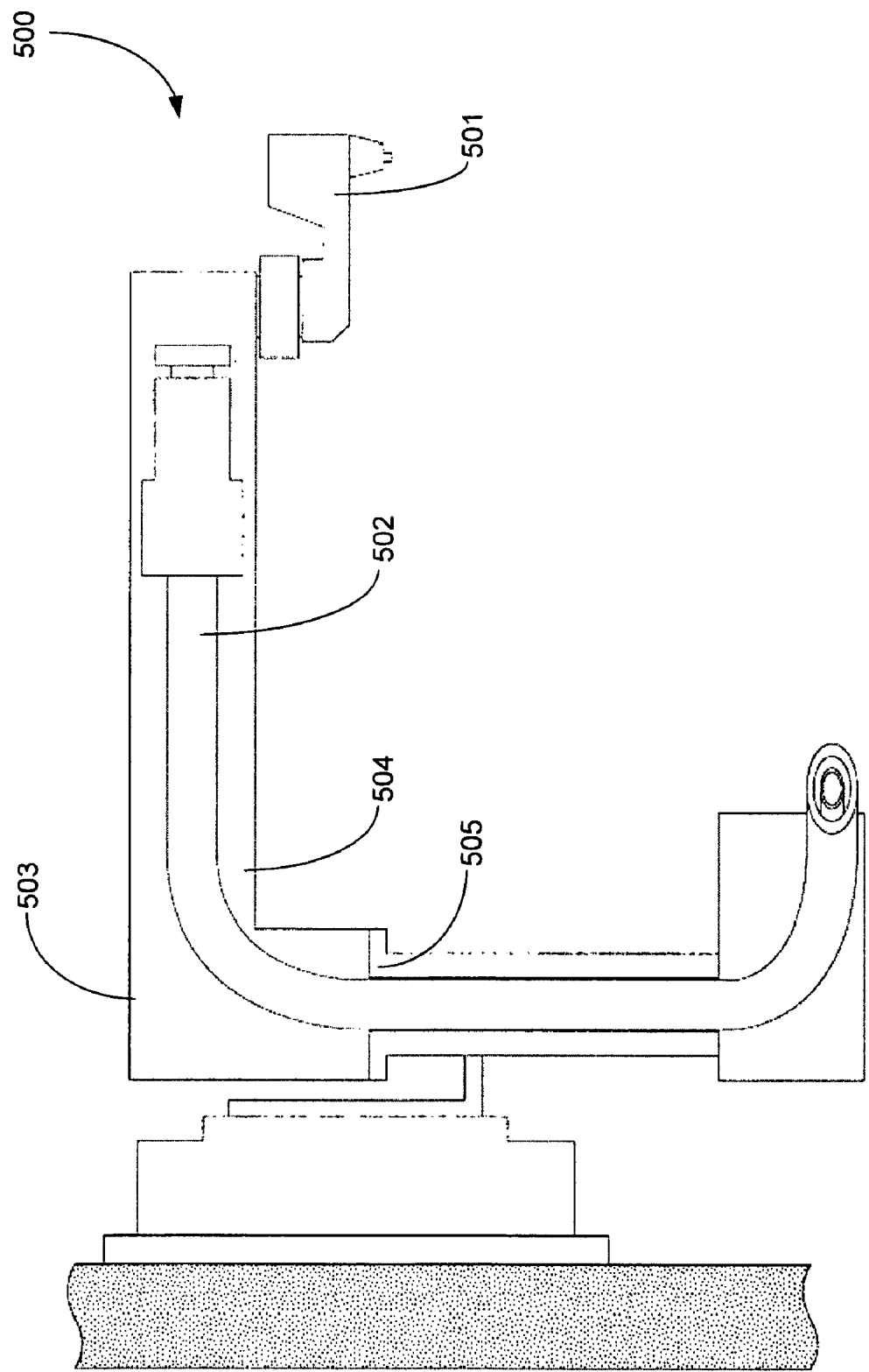
FIG. 5 illustrates a schematic view of a dispense arm assembly according to one embodiment of this invention.

FIG. 5 illustrates a dispense arm assembly 500 according to an embodiment of the invention. The dispense arm assembly 500 includes a nozzle 501 coupled to a supply hose 502 and an arm member 503. The supply hose 502 is coupled to a fluid source (not shown) and delivers the fluid to the nozzle 501. The arm member 503 has an internal chamber 504. The supply hose 502 is routed through this internal chamber 504. One advantage realized by this design is that it eliminates the kinking or twisting experienced by the supply hose during the motion of the dispense arm assembly. There is a stress relief sleeve 505 internal to the arm member 503 that helps to prevent the supply hose 502 from over extending thereby increasing the reliability of the substrate processing apparatus. The dispense arm assembly 500 can be configured as either the dispense arm 206 or the dispense arm 209 described in reference to FIG. 2A.

Figure 6:
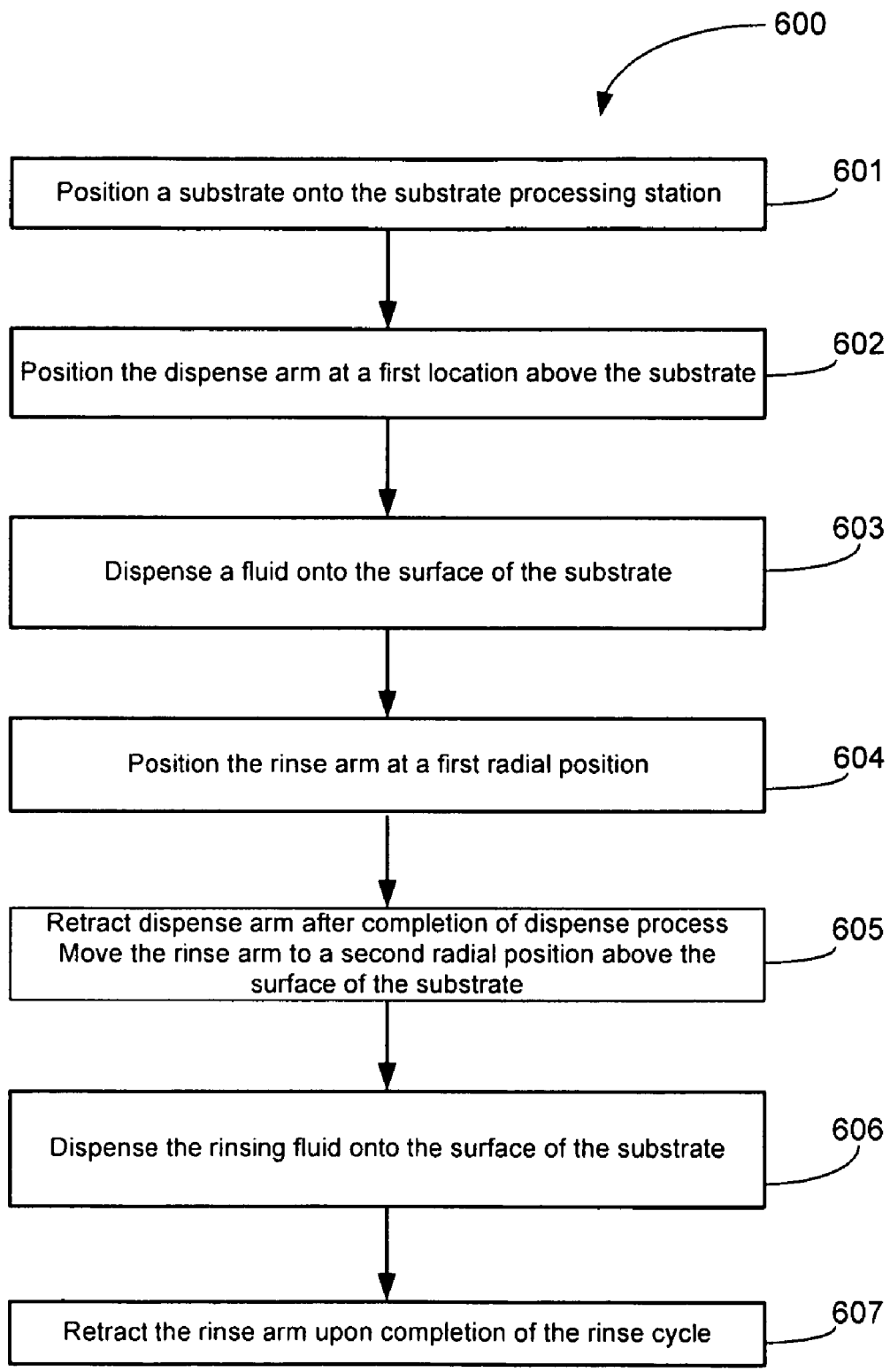
FIG. 6 illustrates a simplified flowchart of a substrate processing method according to one embodiment of this invention.

FIG. 6 is a simplified flowchart illustrating a method 600 of processing a substrate according to one embodiment of the present invention. In step 601 a substrate is positioned on the substrate holder located in the substrate processing station. In one embodiment, the substrate is aligned in a predetermined orientation by rotating the substrate holder 205 of the substrate processing station 202 in a clockwise or anticlockwise direction. The substrate holder of the other substrate processing station 203 can also be similarly rotated to align the substrate. Next, the dispense arm is activated and positioned at a first location above the substrate in step 602. In one embodiment, the location may be the above the center of the wafer. However, one skilled in the art will realize that any other position along the travel path of the dispense arm is possible. Next, the dispense arm dispenses fluid onto the exposed surface of the substrate for a predetermined amount of time in step 603. In addition, depending on the application, the substrate may be rotated at a predetermined speed during the dispensing of the fluid. In one embodiment, the substrate is rotated at a speed between 1000 and 5000 RPM and the fluid is characterized by a developer fluid. However, the same technique can be used to dispense an other type of fluid, for example, a coating or rinsing fluid. In step 604, the rinse arm is activated and moved to a first radial position. The rinse arm is moved to the first radial position before the completion of the dispense cycle. After completion of the dispense cycle the dispense arm is moved back to its home position in step 605. Concurrent to the dispense arm being retracted back to its home position in step 605, the rinse arm is moved to a second radial position above the substrate. This minimizes the time delay in starting the rinse step thereby increasing the throughput of the substrate processing apparatus and minimizing any chances of defects due to stray droplets of the dispensed fluid falling onto the substrate. In step 606, the rinse cycle is activated and the rinse arm dispenses the rinsing fluid onto the substrate for a predetermined period. Next, the rinse arm is retracted back to its home position in step 607.

It should be appreciated that the specific steps illustrated in FIG. 6 provide a particular method of dispensing a fluid onto a substrate according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor substrate processing apparatus comprising:

an enclosure having a first side and a second side, the enclosure comprising:
  a first processing station adjacent the first side and configured to hold a substrate; and
  a second processing station adjacent the second side and configured to hold the substrate, wherein the second processing station is positioned adjacent to the first processing station;
  a first dispense arm configured to deliver a first fluid to the first processing station, wherein the first dispense arm is positioned between the first side and the first processing station;
  a second dispense arm configured to deliver the first fluid to the second processing station, wherein the second dispense arm is positioned between the second side and the second processing station;
  a first rinse arm configured to deliver a rinsing fluid to the first processing station;
  a second rinse arm configured to deliver the rinsing fluid to the second processing station; and
  a drain port shared by the first processing station and the second processing station.

2. The apparatus of claim 1 wherein the first dispense arm and the second dispense arm are configured to travel in a longitudinal direction.

3. The apparatus of claim 1 further comprising a plurality of shutters configured to isolate the first processing station and the second processing station.

4. The apparatus of claim 3 wherein operation of the first processing station is independent of operation of the second processing station.

5. The apparatus of claim 3 wherein:
the substrate processing apparatus further comprises a substrate transport area disposed external to the enclosure; and
the plurality of shutters comprise:
  a first shutter configured to isolate the first processing station from the substrate transport area;
  a second shutter configured to isolate the second processing station from the substrate transport area; and
  a third shutter configured to isolate the first processing station from the second processing station.

6. The apparatus of claim 5 further comprising a panel mounted above the third shutter, wherein at least a portion of the panel overlaps at least a portion of the third shutter.

7. The apparatus of claim 1 further including:
a first exhaust opening coupled to the first processing station and a second exhaust opening coupled to the second processing station, wherein the first exhaust opening is coupled to a first exhaust channel and the second exhaust opening is coupled to a second exhaust channel.

8. The apparatus of claim 7 wherein each of the first exhaust channel and the second exhaust channel include a first exhaust section and a second exhaust section.

9. The apparatus of claim 1 wherein the drain port is configured to provide an egress path to the developer fluid, and the egress path is characterized by a siphon effect.

10. The apparatus of claim 1 comprising a standoff, wherein the standoff has a height in the range of 5 mm to about 25 mm.

11. The apparatus of claim 1 further comprising a third dispense arm configured to deliver the first fluid to the first processing station and a fourth dispense arm configured to deliver the first fluid to the second processing station.

12. The apparatus of claim 11 wherein the third dispense arm and the fourth dispense arm are configured to travel in a radial direction.

13. The apparatus of claim 11 wherein the third dispense arm is positioned perpendicular to the first dispense arm and the fourth dispense arm is positioned perpendicular to the second dispense arm.

14. A track lithography tool including a plurality of substrate processing apparatus, each of the substrate processing apparatus comprising:
    an enclosure having a first side and a second side, the enclosure comprising:
        a first processing station adjacent the first side and configured to hold a substrate; and
        a second processing station adjacent the second side and configured to the substrate, wherein the second processing station is positioned adjacent to the first processing station;
        a first dispense arm configured to deliver a developer fluid to the first processing station, wherein the first dispense arm is positioned between the first side and the first processing station;
        a second dispense arm configured to deliver the developer fluid to the second processing station, wherein the second dispense arm is positioned between the second side and the second processing station;
        a first rinse arm configured to deliver a rinsing fluid to the first processing station;
        a second rinse arm configured to deliver the rinsing fluid to the second processing station; and
        a drain port shared by the first processing station and the second processing station.

15. The track lithography tool of claim 14 wherein a plurality of the substrate processing apparatus are arranged in a vertical stack.

16. The track lithography tool of claim 15 wherein the vertical stack comprises four substrate processing apparatus.

* * * * *